United States Patent [19]
Kamei et al.

[11] Patent Number: 5,281,770
[45] Date of Patent: Jan. 25, 1994

[54] PRINTED CIRCUIT BOARD APPARATUS

[75] Inventors: Shigeru Kamei, Saitama; Yoshimi Watanabe, Gunma, both of Japan

[73] Assignee: Kabushiki Kaisha Toshiba, Kanagawa, Japan

[21] Appl. No.: 707,041

[22] Filed: May 29, 1991

[30] Foreign Application Priority Data

May 31, 1990 [JP] Japan .................. 2-144920

[51] Int. Cl.$^5$ .............................. H05K 1/00
[52] U.S. Cl. .................. 174/261; 174/263; 174/266; 439/84
[58] Field of Search ............. 174/262, 263, 264, 265, 174/266, 261; 439/82, 83, 84

[56] References Cited

U.S. PATENT DOCUMENTS

| | | | |
|---|---|---|---|
| 2,915,678 | 12/1959 | Frazier et al. | 317/101 |
| 3,103,547 | 11/1960 | Ansley | 439/83 X |
| 3,190,953 | 6/1961 | Keller | 439/83 X |
| 3,504,328 | 3/1970 | Olsson | 439/84 X |
| 3,654,583 | 4/1972 | Mancini | 174/261 X |
| 4,881,906 | 11/1989 | MacKanic | 439/83 |
| 5,010,448 | 4/1991 | Kobari | 174/261 X |

FOREIGN PATENT DOCUMENTS 540636 11/1984 Australia .
0331818 9/1989 European Pat. Off. .

Primary Examiner—Leo P. Picard
Assistant Examiner—Cheryl R. Figlin
Attorney, Agent, or Firm—Banner, Birch, McKie & Beckett

[57] ABSTRACT

A printed circuit board apparatus comprises a printed circuit board. The printed circuit board includes a first and a second surface and a hole portion. A printed pattern is formed on the first surface, and a parts having a lead is mounted on the second surface. The printed circuit board apparatus also includes an eyelet and plural solder entering portions. The eyelet includes a curling portion and a head portion positioned on the first and second surfaces of the printed circuit board, respectively, and a cylindrical portion, connecting the head and curling portion, inserted into the hole of the printed circuit board. A plurality of solder entering portions are formed at equal intervals on the curling portion. From the solder entering portions, solder enters into space between the curling portion and the first surface face of the printed pattern surrounding the hole of the printed circuit board and the eyelet.

8 Claims, 11 Drawing Sheets

PRINTED CIRCUIT BOARD APPARATUS

BACKGROUND OF THE INVENTION

1. Field of the Invention

The present invention relates to a printed circuit board apparatus and, in particular, to a printed circuit board and a method and apparatus for mounting heavy or high heat generating components thereon.

2. Description of the Related Art

Generally, printed patterns such as a copper leads are formed on one side of a printed circuit board; components having leads are mounted on the other side. The leads pass through holes on the circuit board and are soldered to lands of the printed patterns.

In mounting heavy parts or high heat components on the circuit board, eyelets are first mounted into holes of the circuit board. This is done to prevent the possible breakage of the circuit board due to separation of the copper leaf from the board caused either by the weight of the components or by the heat deterioration of the circuit board.

FIG. 1 is a perspective view of a printed circuit board apparatus of the prior art. A heavy component or part 20 with leads 22 is mounted on one side (i.e. a part mounting side) 24 of a circuit board 26. Printed patterns 28 are formed on the other side (i.e. printed pattern side) 30 of circuit board 26. Eyelets 32 are fixed to board 26 by positioning them through holes 34 formed on board 26. The ends portion of leads 22, from part mounting side 24, are inserted through holes (cylindrical portions) in eyelets 32 and are soldered to lands 36 of printed patterns 28.

FIGS. 2 (A) through (D) are perspective, sectional and plan views of eyelet 32 shown in FIG. 1. The manner of fixing eyelet 32 to the circuit board is described below with reference to FIG. 2. Eyelet 32, shown in FIG. 2(A), is inserted through hole 34 of printed circuit board 26 from part mounting side 24 (FIG. 2(B)); the end of eyelet 32 projects from printed pattern side 30. One end of eyelet 32 is then curled by a saw-tooth punch, for example, the present punch shown in FIG. 10. By utilizing this curling process, eyelet 32 is fixed to the circuit board, as shown in FIG. 2(C). Curling portion 38 is formed in a continuous ring-shaped or annular configuration on printed pattern side 30, as shown in FIG. 2(D).

FIGS. 3 and 4 are perspective views of curling portion 38 after utilizing the prior art curling method. As shown in these Figures, portion 38 has a generally annular and convex configuration. FIG. 3 shows eyelet 32 with four interrupted sections 381 of curling portion 38 caused by breakage during the curling process. FIG. 4 shows eyelet 32 having a substantially continuous ring-shaped portion 38.

FIG. 5 shows a sectional view of a printed circuit board using an eyelet mounted by the present method. After the curling of eyelet 32, and lead 22 of component 20 is inserted in the hole of eyelet 32, solder 40 is then applied from printed pattern side 30. Soldering is implemented by using, for example, an automatic flow soldering machine. Due to the high viscosity of solder, it is difficult for solder to enter into curling portion 38 whether eyelet 32 has interrupted sections 381 (see FIG. 3) or substantially continuous section (see FIG. 4). As a result, a cavity 42 will form in many cases. The presence of cavity 42 will contribute to breaking of the soldered joint if either a load is added to lead 22 or repeated thermal expansion occurs.

For example, in TVs using printed circuit boards, it is desirable to decrease the length of lead cords, and preferably position them on the circuit board to facilitate assembly and reduce cost. In the event that heavy or high heat generating components are mounted on the boards, breaking of the soldered joints can occur.

SUMMARY OF THE INVENTION

Accordingly, it is an object of the present invention to permit the free flow of solder to minimize the formation of cavities within the curling portion.

It is a further object of the present invention to provide an improved printed circuit board apparatus minimizing the formation of cavities formed within the curling portion during the soldering process.

It is still a further object of the present invention to provide an improved method and apparatus for minimizing the formation of cavities within the curling portion.

In accordance with the present invention, the foregoing object is achieved by providing a printed circuit board apparatus including: a printed circuit board, an eyelet, plural solder entering portions and solder. The eyelet includes a curling portion and a head portion positioned on a first and a second surface of the board, respectively. The eyelet also includes a cylindrical portion connecting the head portion and curling portion, inserted into a hole on the board. A plurality of solder entering portions are formed at equal intervals on the curling portion. The solder fixes a printed pattern, formed on the first surface of the board, surrounding the hole and the eyelet.

In accordance with another aspect of the present invention, the above-stated object is achieved by providing a method and apparatus for fixing an eyelet to a printed circuit board, the eyelet having a cylindrical portion and a head portion formed on one-end of the cylindrical portion. The method comprises the steps of inserting, curling, forming and soldering. The step of inserting includes inserting the cylindrical portion of the eyelet into a hole on the board. The step of curling and forming including curling the other end of the cylindrical portion to form a curling portion after the inserting step, and forming plural solder entering portions at equal intervals on the curling portion, respectively. The step of soldering includes soldering the eyelet to the printed circuit board.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily obtained by reference to the following detailed description considered in connection with the accompanying drawings, in which.

DETAILED DESCRIPTION OF THE PREFERRED EMBODIMENT

Preferred embodiments of the present invention will now be described in more detail with reference to the accompanying drawings. Throughout the drawings, the same numerals are applied to similar element, therefore, the detailed description thereof are not repeated.

Figure 1:
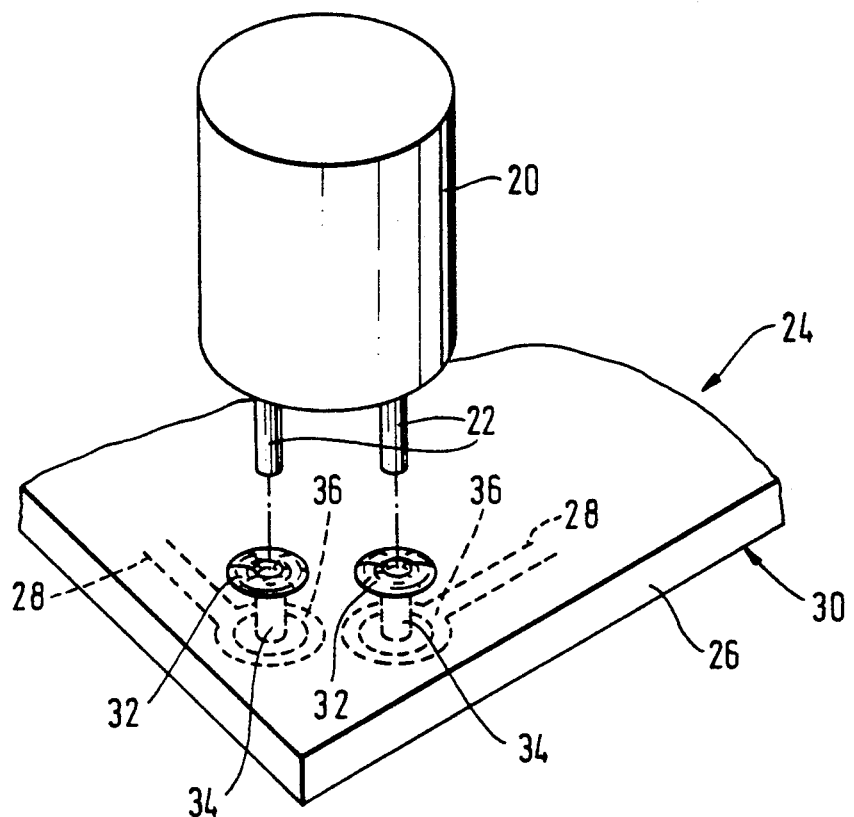
FIG. 1 provides a perspective view of a printed circuit board apparatus of the prior art.
Figure 2A:
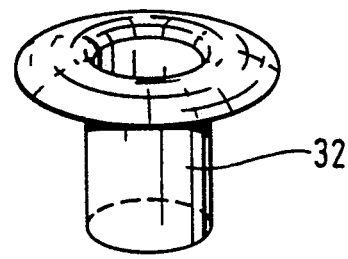
FIGS. 2(A) through (D) show various views of the eyelet shown in FIG. 1.
Figure 2B:
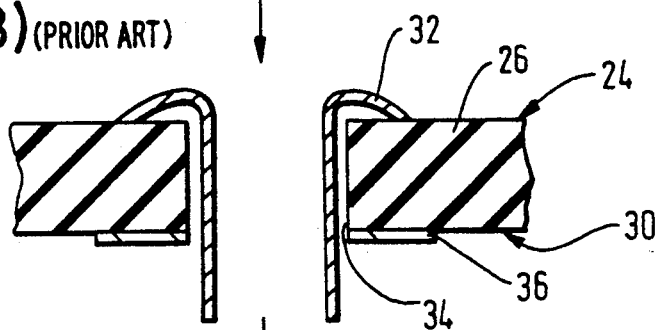
Figure 2C:
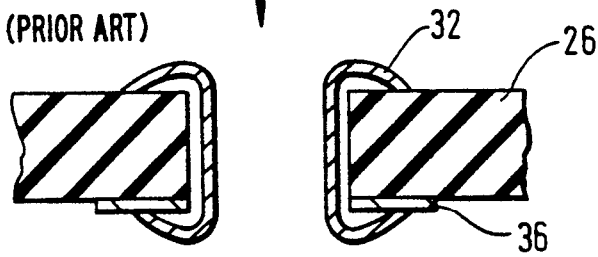
Figure 2D:
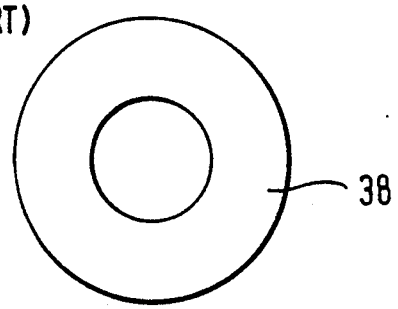
Figure 3:
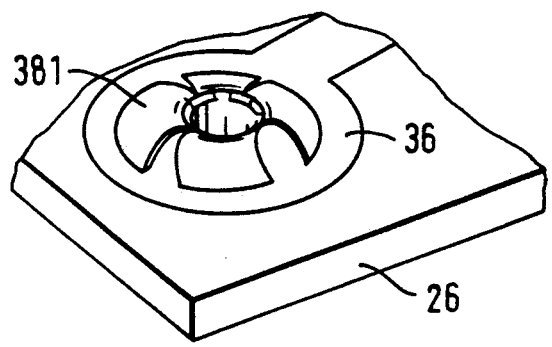
FIGS. 3 and 4 are perspective views of the curling portion of the eyelet shown in FIG. 2.
Figure 4:
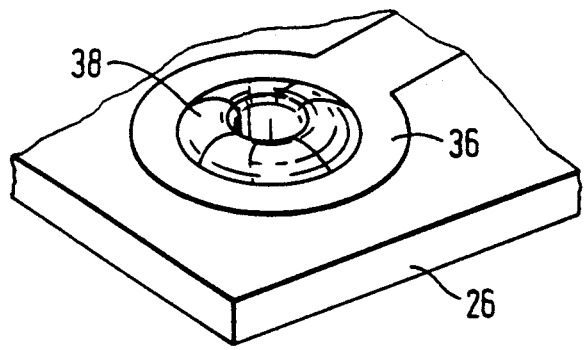
Figure 5:
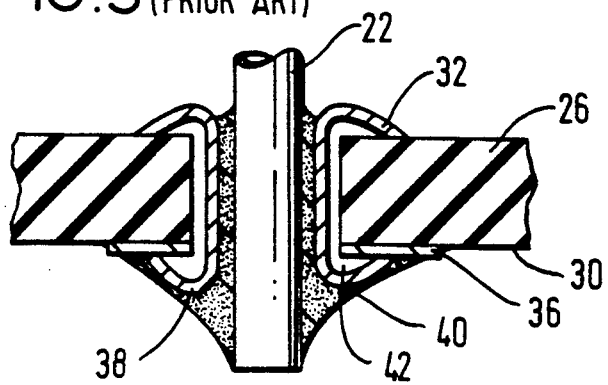
FIG. 5 shows a sectional view of a printed circuit board shown in FIG. 2.
Figure 6A:
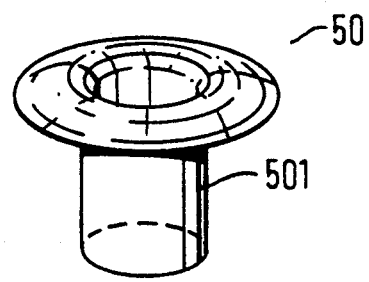
FIGS. 6(A) through (D) are various views of the process of producing a printed circuit board according to the invention.
Figure 6B:
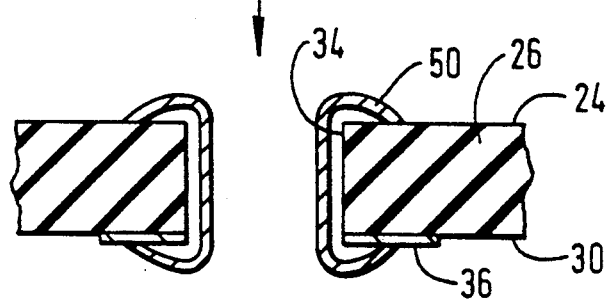
Figure 6C:
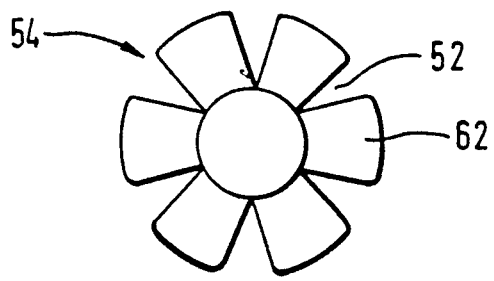
Figure 6D:
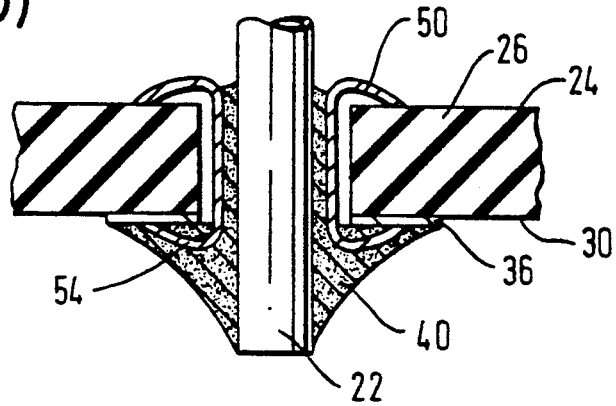

FIGS. 6(A) through (D) show, respectively, a perspective view of an eyelet, a sectional view of a printed circuit board, a plan view of the eyelet, and a sectional view of a printed circuit board formed according to the invention. In this embodiment, a curling portion 54 of eyelet 50 has a plurality of crack portions 52 (FIG. 6(C)). The six separated curling sections 62, separated by crack portions 52, have narrow widths. Accordingly, as shown in FIG. 6(D), solder 40 will easily enter, through 52, and flow into the areas between land 36 and curling portion 54. As a result, a more secure bond occurs between lead 22 and land 36.

A method of fixing eyelet 50 to printed circuit board 26 is described below. Cylindrical portion 501 of eyelet 50 (FIG. 6(A)) is inserted into a hole 34 of printed circuit board 26 from part mounting side 24, as is done with a conventional eyelet. The free-end portion of cylindrical portion 501 projects from printed pattern side 30 of printed circuit board 26. Thus portion 501 is then curled by a saw-tooth punch 60, such as shown in FIG. 7, for securing it the circuit board.

Figure 7:
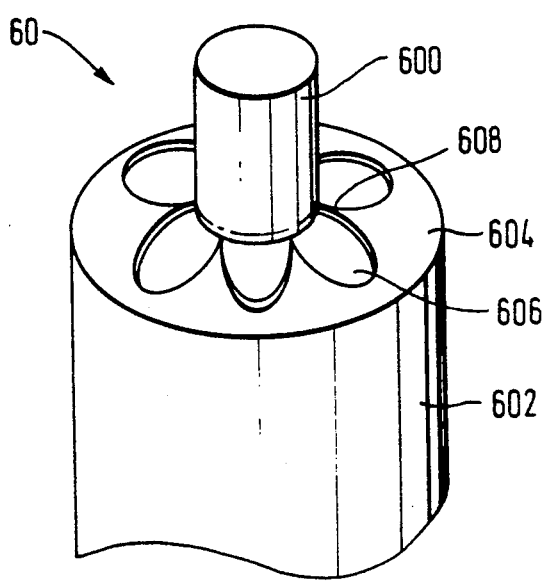
FIG. 7 shows a perspective view of an apparatus used in practicing the process of FIG. 6.
Figure 8:
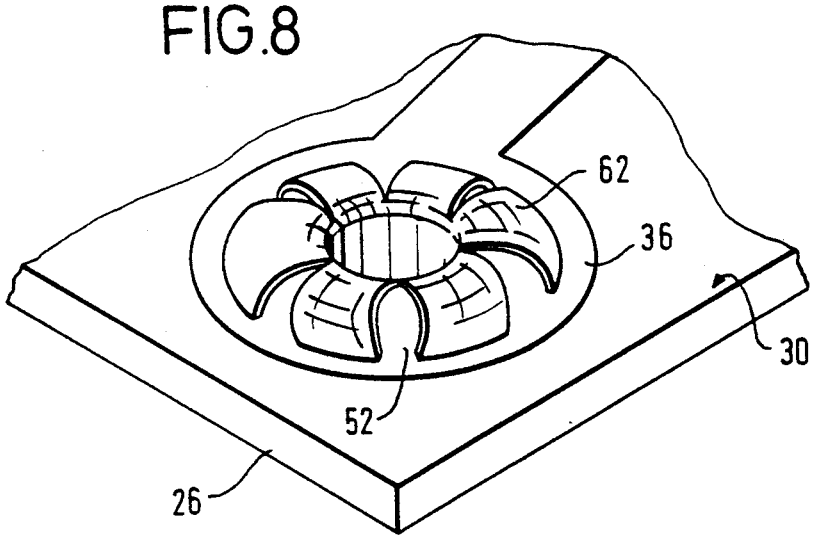
FIG. 8 shows a perspective view of an eyelet formed by the process shown in FIG. 6.

As shown in FIG. 7, punch 60 has a convex cylindrical portion 600 which is inserted into a hole of eyelet 50. Convex portion 600 projects co-axially from a cylindrical body 602. A contact face 604 is formed in body 602 for making cracks in free-end portion of cylindrical portion 501; curling is formed on the surface of body 602 adjacent convex portion 600. That is, plural concaves consisting of a plurality of equally spaced hemispherical concave portions 606 are formed on face 604 according to the number of the cracks and edge portions 608 desired for cracking the free-end portion of eyelet 50. As shown, the concaves extend radially from the aligned axes of portion 600 and body 602. After curling, the free end portion of eyelet 50 is shown in FIG. 8 (and FIG. 6(C)). After curling, portion 54 of eyelet 50 is cracked into a plurality of pieces 62 (e.g., 6 pieces in the embodiment shown). Crack portions 52 provide inlets thereby providing paths to the inside of curling portion 54 for the flow of solder 40. After curling, lead 22 of parts 20 is inserted into the hole of eyelet 50 from part mounting side 24 of printed circuit board 26. Solder 40 is then sprayed from printed pattern side 30 and enters into curling portion 54 via crack portions 52. Thus, soldering is implemented without producing cavities.

Additionally, it is desirable to having five or more solder entering portions (i.e., crack portions 52).

Figure 10:
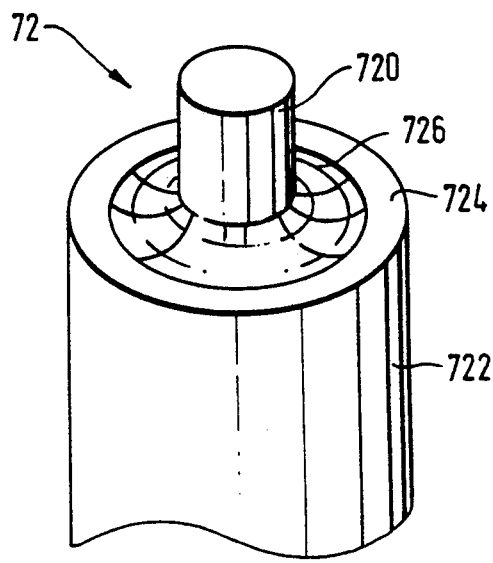
FIG. 10 shows a perspective view of an apparatus used in practicing the process of FIG. 9.
Figure 9A:
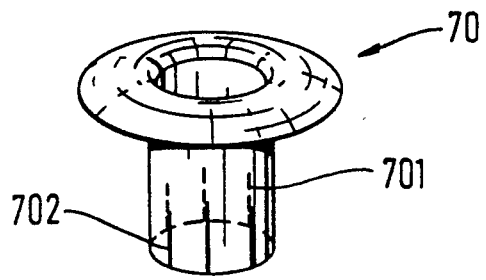
FIGS. 9(A) through (D) are various views of the process of producing another printed circuit board according to a further embodiments of the invention.
Figure 9B:
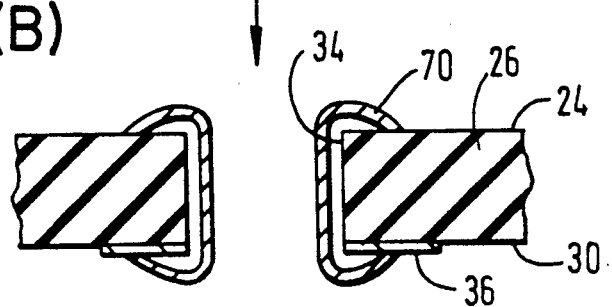
Figure 9C:
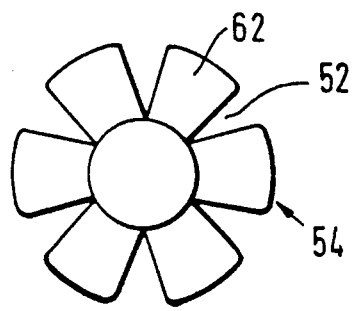
Figure 9D:
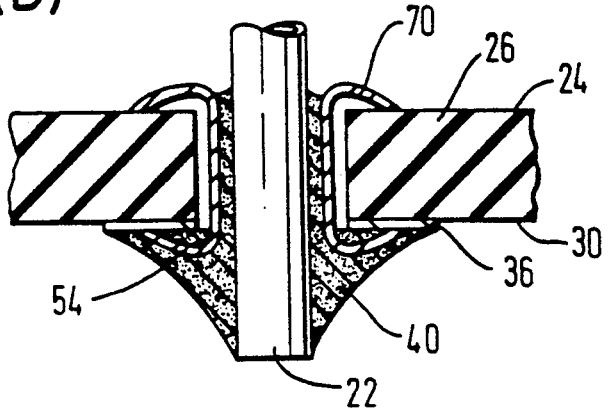

FIGS. 9(A) through (D) show a second embodiment according to the invention. FIG. 9(A) is a perspective view of an eyelet 70. FIGS. 9(B) through (D) correspond to FIGS. 6(B) through (D). This second embodiment is nearly the same as the first embodiment except for eyelet 70 and the use of a saw-tooth punch for curling eyelet 70. The resulting printed circuit board apparatus shown in FIG. 9(D) is nearly the same as the one shown in FIG. 6(D). In this embodiment, the free-end portion of cylindrical portion 701 of eyelet 70 is cracked in advance thereby forming pre-formed equally spaced cracks 702 on cylindrical portion 701 (FIG. 9(A)). The free-end portion of eyelet 70 is inserted, from part mount side, into hole 34 of circuit board 26 and projects from printed pattern side 30 of circuit board 26. The free-end portion of cylindrical portion 701 is then curled by a conventional saw-tooth punch 72, as shown in FIG. 10, for securing it to printed circuit board 26. Punch 72 has a convex portion 720, projecting from body 727, for inserting into a hole of eyelet 70. A contact face 724 is formed on the surface of body 722 adjacent convex portion 720 for curling the free-end of portion 701. In particular, a concave portion 726 is formed on contact face 724 for curling the free-end of portion 701. The use of a conventional punch with pre-formed cracks on eyelet 70 causes the formation of separated curling sections 62 separated by crack portions 52.

Figure 11A:
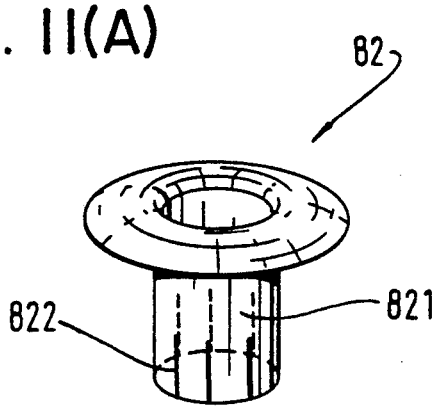
FIGS. 11(A) through (D), through FIGS. 15(A) through (D) are various views showing other processes of producing a third to a seventh printed circuit boards according to further embodiments of the invention.
Figure 11B:
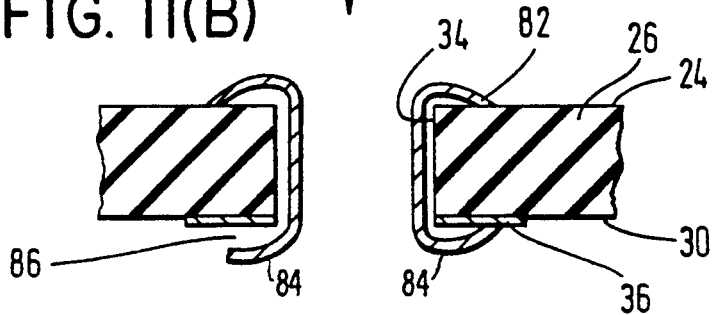
Figure 11C:
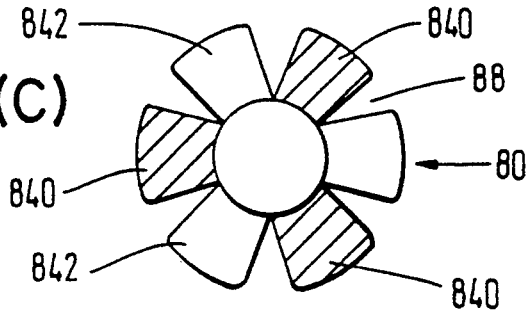
Figure 11D:
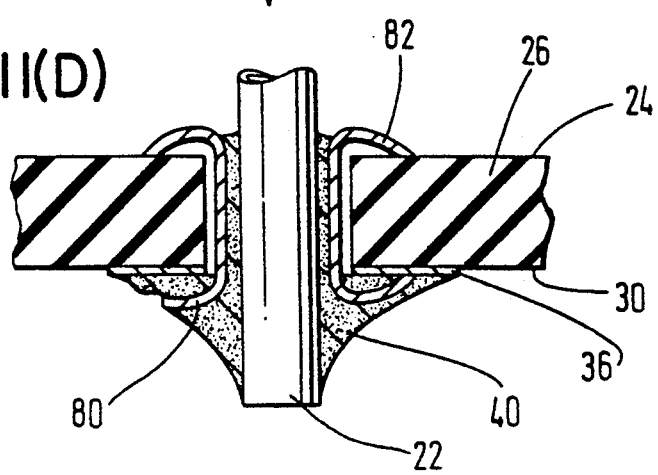

FIGS. 11(A) through (D) show a third embodiment according to the invention. FIGS. 11(B) and (C) are a sectional and plan views from the printed pattern side 30 of printed circuit board 26. FIG. 11(D) is a sectional view of a printed circuit board apparatus. A curling portion 80 of an eyelet 82 has a plurality of separated pieces 84 (e.g. six pieces) which, when curled alternately, contact land 36. The six pieces 84 of curling portion 80 are curled in a manner so that they alternately contact land 36. In FIG. 11(C), oblique line portions 840 are separated curling portions which are curled at a small angle, while separated curling portions 842 are curled at a larger angle for permitting their contact with land 36. In accordance with this structure, space 86 is formed between land 36 and the separated pieces 840 curled at a small angle. Space 86 and crack portions 88 provide a solder entering inlet to permit the complete flow of solder throughout the area separately the curled portions and land 36. As a result, no cavity is formed inside of curling portion 80. With this embodiment, the adhesion of solder 40 increases while increasing the integrity of the soldered joint.

A method of fixing eyelet 82 to printed circuit board 26 is described below. The free-end portion of cylindrical portion 821 of eyelet 82 is first cracked (FIG. 11(A)) in advance thereby forming pre-formed equally spaced cracks 822 on cylindrical portion 821. Cylindrical portion 821 is inserted into hole 34 of circuit board 26 from part mounting side 24. Then, the free-end portion of cylindrical portion 821, projecting from printed pattern side 30, is curled and separated into alternating pieces 840, 842 by a saw-tooth punch which has a structure not shown.

As a result, alternating portions are curled at a small angle and a larger angle; only the free end portion of the latter contact land 36 (FIG. 11(B)). Then, lead 22 of component 20 is inserted into the hole of eyelet 82. Solder 40 is applied and directly enters into the hole of eyelet 82 to curling portion 84 via space 86 and crack portion 88 (FIG. 11(D)).

Figure 12A:
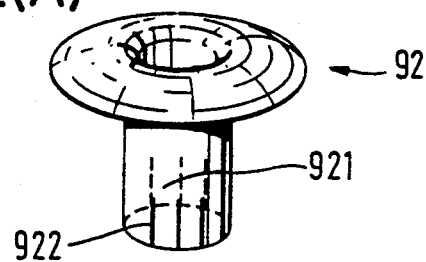
Figure 12B:
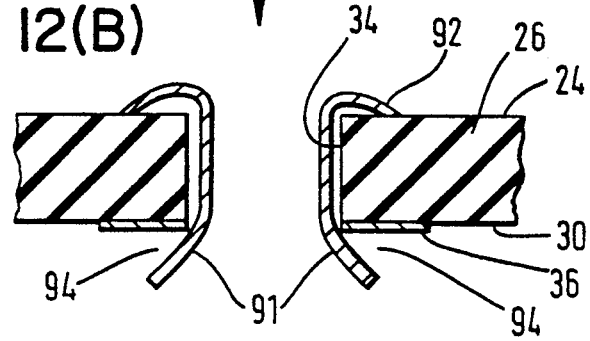
Figure 12C:
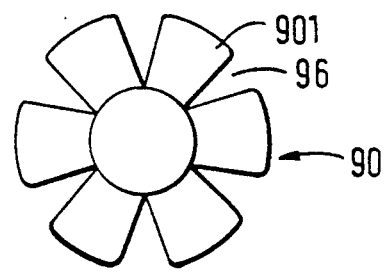
Figure 12D:
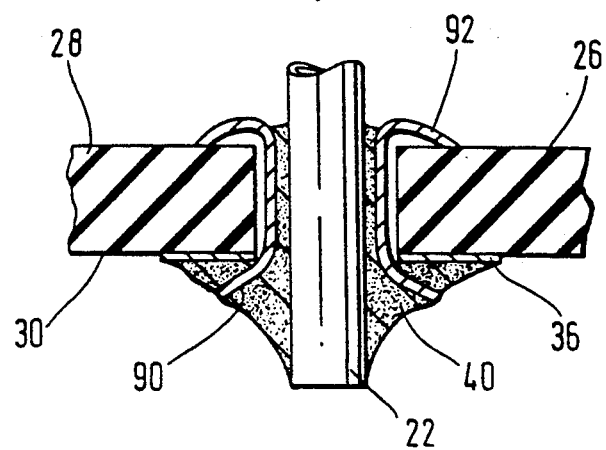

FIGS. 12(A) through (D) show a fourth embodiment according to the invention. FIG. 12(D) is a sectional view of a printed circuit board apparatus. A curling portion 90 of an eyelet 92 has a plurality of separated pieces 901 as shown in FIG. 12(C). Separated pieces 901 of curling portion 90 are curled at a smaller angle near the free-end portion thereof. While the free-end portion of curling portion 90 does not contact land 36 of printed circuit board 26, its root 91 contacts the lip of hole 34, rather than fully contacting land 36. This rigidly fixes eyelet 92 to hole 34. Solder 40 is applied and directly enters via curled portions 96 into space 94 between land 36 and pieces 901, and also enters into hole 34.

A method of fixing eyelet 92 to printed circuit board 26 is described below. The free-end portion of cylindrical portion 921 is first cracked (FIG. 12(A)) in advance thereby forming pre-formed equally spaced cracks 922 on cylindrical portion 921 in the same manner described above with the third embodiment. Cylindrical portion 921 is inserted into hole 34 from part mounting side 24. Then, the free-end portion of cylindrical portion 921, projecting from printed pattern side 30, is curled and separated into pieces 901. With this embodiment, curling is performed by a sawtooth punch (not shown) so that the root 91 of curling portion 90 immediately immerging from hole 34 contacts the lip of hole 34, while its remaining portion is angled slightly toward land 36 (FIG. 12(B)). After lead 22 of component 20 is inserted into hole 34. solder is applied. Solder 40 enters into space 94 (FIG. 12(B)) between land 36 and separated pieces 901 and into curling portion 90 via crack portions 96 and hole 34 (FIG. 12(D)).

Figure 13A:
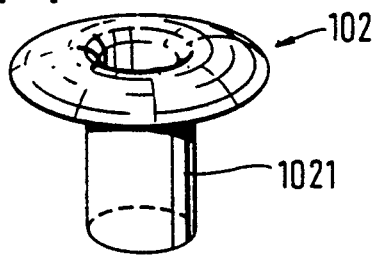
Figure 13B:
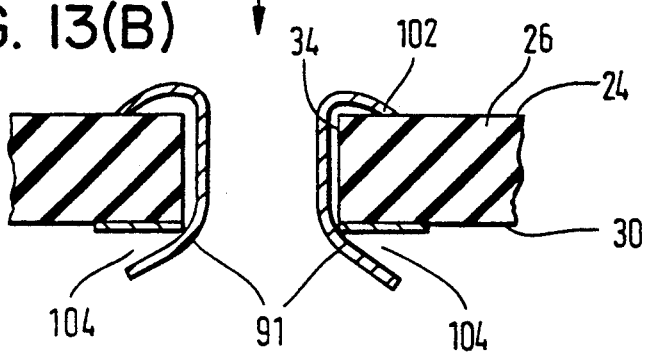
Figure 13C:
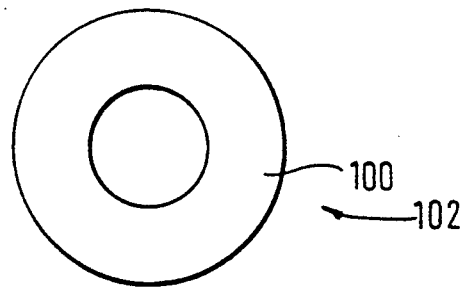
Figure 13D:
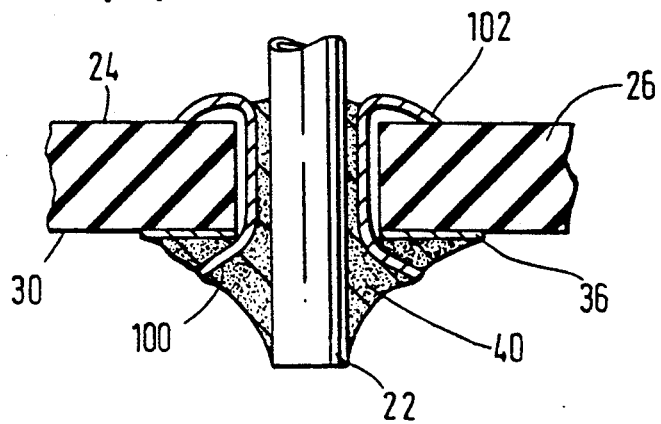

FIGS. 13(A) through (D) show a fifth embodiment according to the invention. FIG. 13(D) is a sectional view of a printed circuit board apparatus. A curling portion 100 is not pre-formed with cracks as in the fourth embodiment shown in FIG. 12(D). FIG. 13(C) shows a plan view of an eyelet 102. Curling portion 100 is curled at a smaller angle near the free-end portion thereof and does not contact land 36. However, its root 91 contacts the lip of hole 34 in the same manner as in the fourth embodiment. Solder 40 enters into space 104 between land 36 and curling portion 100, and also enters into hole 34.

In this case, there is a substantial number of solder entering portions as compared to the other embodiments.

A method of fixing eyelet 102 to printed circuit board 26 is described below. In this embodiment, a conventional type eyelet is used (FIG. 13(A)). The free-end portion 100 of cylindrical portion 1021 is inserted into hole 34 from part mounting side 24. The free-end portion, projecting from printed pattern side 28, is curled so that it does not contact land 36, and root 91 contacts the lip of hole 34. This curling is performed by a saw-tooth punch which has a special structure not shown (FIG. 13(B)). After lead 22 of component 20 is inserted into the hole of eyelet 102, solder is applied. Solder 40 directly enters into space 104 between land 36 and the free-end portion of curling portion 100, and also enters into hole 34. As with the previous embodiments, the embodiment produces the free flow of solder in all areas without the formation of cavities.

Figure 14A:
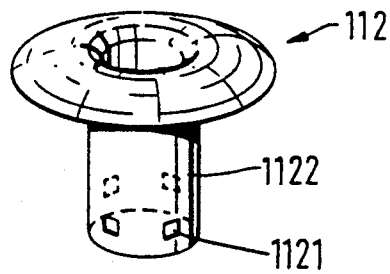
Figure 14B:
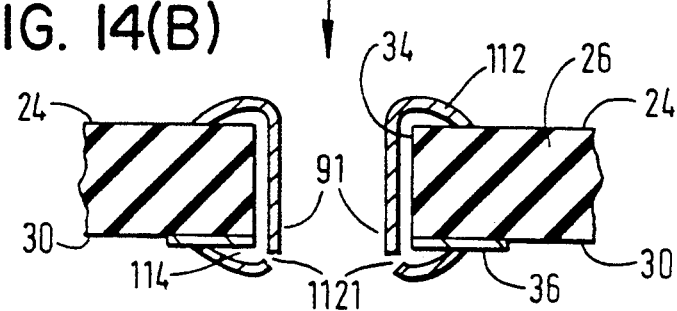
Figure 14C:
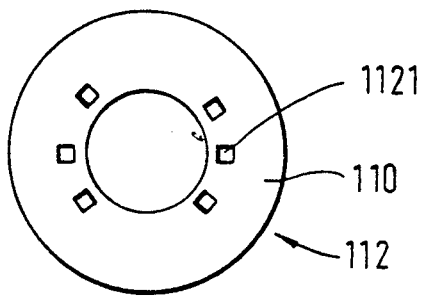
Figure 14D:
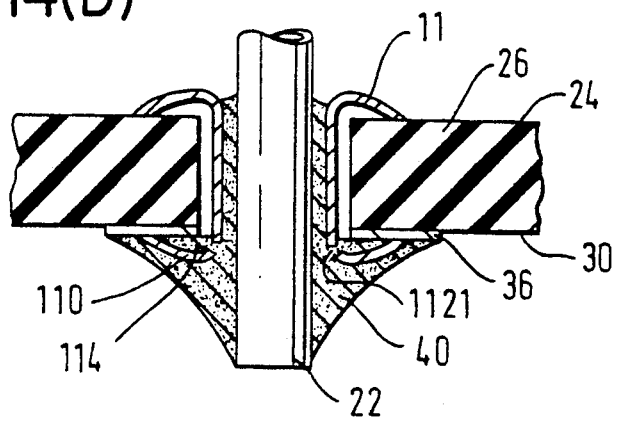

FIGS. 14(A) through (D) shows a sixth embodiment according to the invention. FIG. 14(D) is a sectional view of a printed circuit board apparatus. A curling portion 110 of an eyelet 112 is not pre-formed with cracks. The free-end portion of curling portion 110 contacts land 36 of printed circuit board 26. Curling portion 110 has a plurality of holes 1121 at the root thereof (See FIG. 14(C)). FIG. 14(C) shows a plan view of eyelet 112 from printed pattern side 30. Solder 40 enters into a space 114 between curling portion 110 and land 36 through holes 1121 on curling portion 110 without the formation of cavities.

A method of fixing eyelet 112 to printed circuit board 26 is described below. Eyelet 112 is a conventional type except that it includes a plurality of holes 1121 formed on cylindrical portion 1122. Cylindrical portion 1122 is inserted into hole 34 of printed circuit board from part mounting side 24. Its free-end point portion projects from printed pattern side 30 and is then curled by a conventional saw-tooth punch such as the one shown in FIG. 10 (see FIG. 14(B)). After lead 22 of component 20 is inserted into hole 34 of printed circuit board 26, solder is applied. Solder 40 enters into space 114 through holes 1121 and also enters into hole 34 (FIG. 14(D)).

Figure 15A:
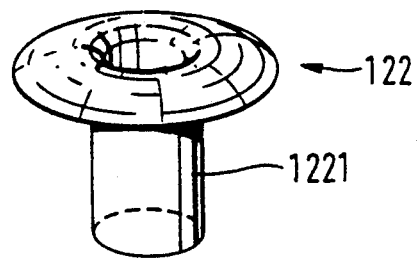
Figure 15B:
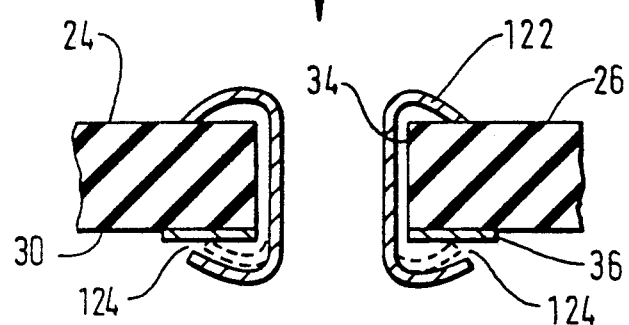
Figure 15C:
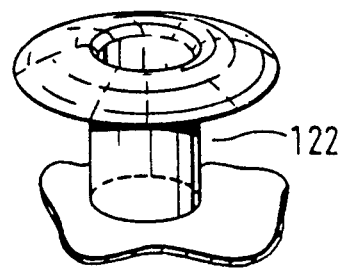
Figure 15D:
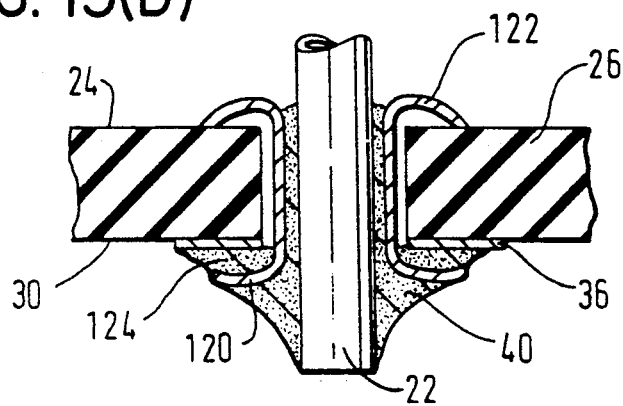

FIGS. 15(A) through (D) shows a seventh embodiment according to the invention. FIG. 15(D) is a sectional view of a printed circuit board apparatus while FIGS. 15(B) and 15(C) are sectional and prospective views, respectively. A curling portion 120 of eyelet 122 is not pre-formed with cracks. During the curling process, a wavy shape is formed on curling portion 120. Space 124 is formed between land 36 and curling portion 120 by the convex and concave wave. This process provides a larger space between land 36 and the free-end portion of the eyelet at one section and a smaller spare at another section. Solder 40 enters into space 124 and hole 34 of eyelet 122.

A method of fixing eyelet 122 to printed circuit board 26 is described below. Eyelet 122 is a conventional type. Cylindrical portion 1221 of eyelet 122 is inserted into hole 34 of printed circuit board 26 from part mounting side 24. Then, the free-end portion of cylindrical portion 1221 projects from printed pattern side 30 and is curled with a wavy pattern by a saw-tooth punch which has a structure (not shown). After lead 22 of component 20 is inserted into hole 34, soldering is applied. Solder 40 directly enters into space 124 and hole 34 and freely flows into all areas thereby avoiding the formation of cavities.

What is claimed:

1. A printed circuit board apparatus comprising:
   a printed circuit board having a first surface on which a printed pattern is formed, a second surface on which a component with at least one lead is mounted by solder, and a hole formed through said first and second surfaces; and
   an eyelet inserted through said hole for receiving the lead, said eyelet including a curling portion and a head portion positioned, respectively, on the first and second surfaces of the printed circuit board, said curling portion being split into a plurality of sections which alternately contact the printed pattern for permitting the solder to enter into the space between the curling portion and the first surface of the printed circuit board.

2. A printed circuit board apparatus comprising:
a printed circuit board including a first surface on which a printed pattern is formed, a second surface on which a component with at least one lead is mounted by solder, and a hole formed through said first and second surfaces; and
an eyelet inserted through said hole for receiving the lead, said eyelet including a curling portion and a head portion positioned, respectively, on the first and second surfaces of the printed circuit board, said curling portion including a plurality of holes formed therethrough for permitting the solder to enter into the space between the curling portion and the first surface of the printed circuit board.

3. An eyelet for reinforcing a printed circuit pattern, formed on a surface of a printed circuit board, surrounding a hole formed in the printed circuit board comprising:
a cylindrical portion having first and second ends;
a head portion at the first end of the cylindrical portion; and
a plurality of holes formed in the second end of the cylindrical portion for permitting the free flow of solder therethrough.

4. A method of fixing an eyelet to a printed circuit board, said eyelet comprising a cylindrical portion having a first end and a second end, a head portion being formed at the first end of the cylindrical portion, the method comprising the steps of:

inserting the cylindrical portion of the eyelet into a hole in the printed circuit board;
curling the second end of the cylindrical portion so that the cylindrical portion is split into a plurality of sections and so that the sections alternately contact the printed circuit board; and
soldering the eyelet to the printed circuit board.

5. A method of fixing an eyelet to a printed circuit board, said eyelet comprising a cylindrical portion having a first end and a second end, a head portion being formed at the first end of the cylindrical portion, the method comprising the steps of:
forming holes in the second end of the cylindrical portion of the eyelet;
inserting the cylindrical portion of the eyelet into a hole in the printed circuit board;
curling the second end of the cylindrical portion; and
soldering the eyelet to the printed circuit board.

6. The printed circuit board apparatus according to claim 2, wherein said curling portion has a continuous peripheral edge.

7. The method of fixing an eyelet to a printed circuit board according to claim 4, further comprising the initial step of:
pre-forming a plurality cracks at equal intervals on the cylindrical portion, and
wherein said step of curling comprises curling the second end of the cylindrical portion so that the cylindrical portion is split along said cracks into a plurality of sections.

8. The method of fixing an eyelet to a printed circuit board according to claim 5, wherein said step of curling comprises curling the second end of the cylindrical portion to contact the printed circuit board.

* * * * *